United States Patent [19]

Klayman

[11] Patent Number: 5,406,281
[45] Date of Patent: Apr. 11, 1995

[54] ENCODER/DECODER AND METHOD FOR EFFICIENT STRING HANDLING IN DATA COMPRESSION

[75] Inventor: Jeffrey T. Klayman, Canton, Mass.

[73] Assignee: Codex Corporation, Mansfield, Mass.

[21] Appl. No.: 134,789

[22] Filed: Oct. 12, 1993

[51] Int. Cl.⁶ ............................................. H03M 7/30
[52] U.S. Cl. .................................................... 341/51
[58] Field of Search ................ 341/51, 50, 67, 106, 341/87; 235/310, 311

[56] References Cited

U.S. PATENT DOCUMENTS

| | | | |
|---|---|---|---|
| 4,558,302 | 12/1985 | Welch | 341/51 |
| 5,058,144 | 10/1991 | Fiala et al. | 375/122 |
| 5,153,591 | 10/1992 | Clark | 341/51 |
| 5,243,341 | 9/1993 | Seroussi et al. | 341/51 |

OTHER PUBLICATIONS

"Data Compression Procedures for DCEs Using Error Correcting Procedures", International Telegraph and Telephone Consultative Committee, 29 Sep. 1989 Study Group XVII.

Primary Examiner—Brian K. Young
Attorney, Agent, or Firm—Darleen J. Stockley

[57] ABSTRACT

A method (100) and device (200) increase efficiency of a data compression encoder or decoder by testing whether an input string is a maximum length string upon successful match of the input string in a dictionary. Where the length of the input string is equal to a predetermined maximum string length, the string matching process is terminated without processing an additional input character that would cause an unsuccessful string match. The maximum length string test is accomplished by testing a string length counter for the value zero, where the string length counter is set to the maximum string length value when the input string is NULL or alternatively is set to the maximum string length minus one when the input string is a one character string, and the string length counter is decremented for each input character that extends the matched input string.

45 Claims, 6 Drawing Sheets

ENCODER/DECODER AND METHOD FOR EFFICIENT STRING HANDLING IN DATA COMPRESSION

FIELD OF THE INVENTION

The present invention relates generally to data compression, and more particularly to increasing string manipulation efficiency in data compression.

BACKGROUND

Data communication is the movement of computer-encoded information from one point to another by means of a transmission system. Data communication results in nearly instantaneous information exchange over long distances.

Data communication links data terminal equipment (DTE) such as a terminal, printer or computer that transmits or receives data. Data communication equipment (DCE) is a device attached between a DTE and the communication channel that manipulates the transmitted signal or data. The DCE usually comprises a microprocessor and random access memory (RAM). The communication channel is often a telephone network, although it could be a cellular network, a digital communication network, or a satellite network.

The information sent by a transmitter DTE (TXDTE) to a receiver DTE (RXDTE) consists of a sequence of characters. The information generally contains a significant amount of redundancy. The information, therefore, may be compressed so that it can be transmitted in less time over a communication channel.

Among known data compression methods is the Ziv-Lempel '78 algorithm ("ZL78"). In the ZL78 algorithm, the transmit DCE (TXDCE) records the history of recently transmitted data by storing the strings in a vocabulary (also referred to as the "vocabulary tree") stored in the TXDCE RAM. By comparing successive elements of the current data with the vocabulary, redundant data is found. The TXDCE, instead of sending the entire redundant sequence, sends a codeword which points to the location of the earlier occurrence of the redundant data in the vocabulary tree. Data compression occurs whenever the number of bits required to send the codeword is less than the number of bits in the redundant data sequence.

At the other end of the channel, the receiver DCE (RXDCE) maintains a vocabulary in the RXDCE RAM similar to that maintained by the TXDCE. Upon receipt of the codeword from the TXDCE, the RXDCE uses the codeword to find the redundant data sequence in the vocabulary. The RXDCE then transmits the data sequence to the TXDTE.

As the information is transmitted, the TXDCE builds a vocabulary according to a set of rules. The vocabulary is a tree structure data base with various levels of interconnected nodes. A full description of a procedure for building the tree, updating the tree, deleting nodes from the tree and adding nodes to the tree may be found in Clark, U.S. Pat. No. 5,153,591 and Welsh, U.S. Pat. No. 4,558,302. Such a tree structure has been implemented in V.42bis applications for the CCITT (Comite Consultatif International de Telegraphie et Telephonie).

When successive input characters are compared with strings in the vocabulary to find redundant data, a succession of input characters that matches a string in the vocabulary may be called a partially matched string. To find a longest matched string, the vocabulary is searched for a new string which is the string formed by appending the next input character onto the partially matched string. If the new string is in the vocabulary, then the string matching continues, using the new string as the partially matched string. If the new string is not in the vocabulary, then the string matching is terminated, and the partially matched string is the longest matched string. The codeword representing the longest matched string is then sent, and the vocabulary is updated to include the new string.

In a typical implementation, a string length counter is incremented for each input character that extends the partially matched string. If a new string is not in the vocabulary, then the string length counter represents the length of the longest matched string. Before adding the new string to the vocabulary, the string length counter is tested, and the new string is only added if its length is less than or equal to a predetermined maximum string length. Testing the string length counter prior to adding a string to the vocabulary requires significant amounts of microprocessor usage, and performing such operations unnecessarily is particularly wasteful of microprocessor resources. Thus, a method eliminating the testing of the string length counter prior to adding a string to the vocabulary would be valuable.

DETAILED DESCRIPTION OF A PREFERRED EMBODIMENT

In a typical implementation without the present invention, for example, in accordance with V.42 bis, a string length counter is incremented for each input character that matches a string in the vocabulary. When an input character is a non-match for the strings in the vocabulary, the unmatched input character is added to the longest matched string to provide a new string only where the length of the new string is less than or equal to a predetermined maximum string length. In accordance with the V.42bis standard, maximum string length is checked as part of an add function. Thus, there is a check made for maximum string length each time a character is added to the vocabulary. The check compares the string length counter to a predetermined maximum string length (parameter N7 in V.42bis).

Furthermore, where a string of maximum string length has been matched, the encoder must process one more input character with which it performs a search operation. The search must, by definition, result in a non-match. The codeword for the matched string is then sent, and the unmatched character is used to start a new string.

In the preferred embodiment of the present invention, where there is not a partially matched string in the encoder, the string length counter is set to a predetermined maximum string length (e.g., N7). When a new string is started, the string length counter is set to one less than the predetermined maximum string length (e.g., N7−1). For each input character that matches a string in the vocabulary, the string length counter is decremented. Where the string length counter reaches zero, the encoder has matched the predetermined maximum string length, and a codeword for the maximum length string is sent. Then a next input character is used to start a new string.

In a M68000 assembly language the test for whether a string length counter is equal to zero is simply a conditional branch following the decrement of the string length counter. In the prior art, the code would normally have taken an unconditional branch at the end of a matched portion of code to continue processing input characters. In the present invention, by replacing the unconditional branch with the conditional branch, both of which have identical execution times, the code that is executed when a match occurs takes no more time to execute even though it tests whether the string length counter is equal to zero. However, the add function is simplified and executes faster because the check for the predetermined maximum string length is removed.

The add function is also simplified by removing the check for a duplicate string. Instead, in the present invention, when the process character function (PCF) detects a duplicate string, the PCF does not invoke the add function. Thus, the present invention provides a logic change to the PCF.

Figure 1:
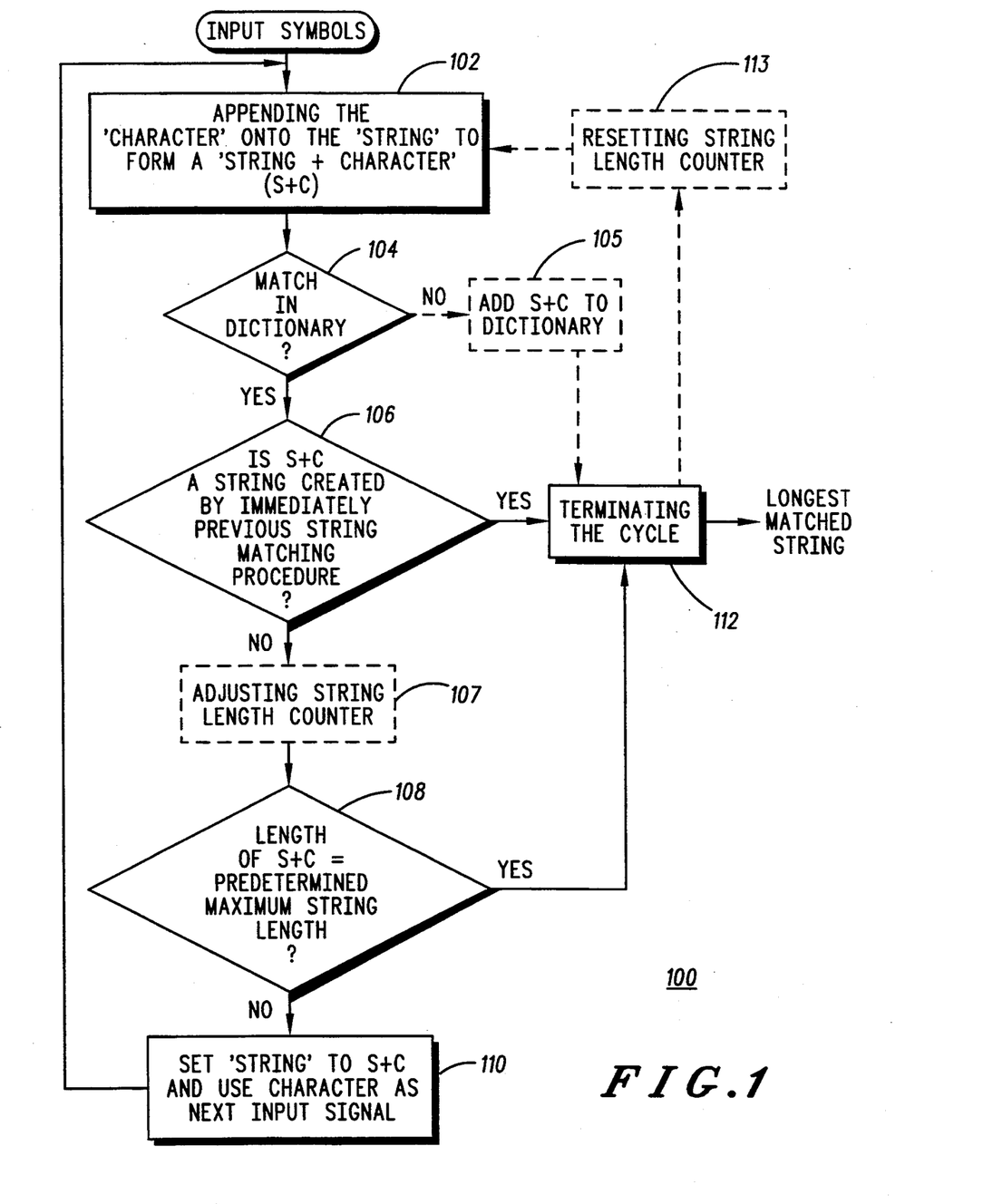
FIG. 1 is a flow diagram illustrating the steps of an embodiment of the method of the present invention.

FIG. 1, numeral 100, is a flow diagram illustrating the steps of an embodiment of the method of the present invention. The method (100) efficiently provides a longest matched string for a plurality of input symbols in a data compression encoder/decoder, wherein a 'string' begins as one of: a first input/received symbol and a null string and a 'character' is, correspondingly, one of: a next input/received symbol and a first input/received symbol, utilizing a string matching procedure. The method includes, for each cycle of string matching, the steps of: 1) appending the 'character' onto the 'string' to form a 'string+character' (S+C) (102); 2) searching for a match of the 'string+character' in a dictionary (104); 3) where there is a successful match, testing whether the 'string+character' is a string created by the string matching procedure executed immediately previously (106); 4) where the 'string+character' is a string other than the string created by the immediately previous string matching procedure, determining whether a length of the 'string+character' is equal to a predetermined maximum string length, (108); 5) where the string length is unequal to (i.e., less than) the predetermined maximum string length, recycling to step 1A, and continuing the string matching procedure with 'string+character' as the 'string' and 'character' as the next input symbol (110), and 6) terminating the cycle of the string matching procedure (112) where one of: (6a) the string length is equal to the predetermined maximum string length, (6b) the 'string+character' is the string created by the immediately previous string matching procedure, and (6c) there is an unsuccessful match in step 2.

Where selected, prior to testing whether the length of the 'string+character' is equal to the predetermined maximum string length, a string length counter may be adjusted to represent the length of the 'string+character' (107). In one implementation, adjusting the string length counter to represent the length of the 'string+character' may include decrementing a value of the string length counter.

Typically, the step of determining whether the length of the 'string+character' is equal to a predetermined maximum string length (108) includes comparing the value of the string length counter to a predetermined checking value. Where the string length counter is preset to a predetermined maximum string length and the string length counter is decremented as indicated above, the predetermined checking value is equal to zero.

Where the length of the 'string+character' is equal to the predetermined maximum string length, a recycling step may be included for recycling to restart the string matching procedure with 'string' equal to the NULL string. Where the 'string' is the null string, a step of resetting a string length counter to a NULL string length value may also be included. The NULL string length value is typically equal to the predetermined maximum string length.

Alternatively, where the length of the 'string+character' is equal to the predetermined maximum string length, a recycling step may be included for recycling to restart the string matching procedure with 'string' equal to a next input symbol. Where the 'string' is the null string, a step of resetting a string length counter to a one character string length value may also be included. Typically, the one character string length value is equal to the predetermined maximum string length minus one.

Where the length of the 'string+character' is equal to the predetermined maximum string length (108-YES), the 'string+character' represents a longest matched string.

Clearly, where the 'string' is the null string, the string length counter is set to a NULL string length value, typically the predetermined maximum string length.

It is clear that, where the 'string+character' is the string created by the string matching procedure executed immediately previously, the 'string' is the longest matched string. Typically, upon obtaining the longest matched string, the string matching procedure may continue by recycling to the first step and restarting the string matching procedure with the 'character' as the 'string'. In this procedure, the string length counter is reset to a one character string length value. Typically, the one character string length value is selected to be equal to the predetermined maximum string length minus one.

Where there is an unsuccessful match (104-NO), the 'string' represents the longest matched string and the 'character' represents an unmatched character.

Typically, following an unsuccessful match (104-NO), the string matching procedure may be selected to restart with the 'character' from the "string+character' as the 'string', and, where selected, by resetting the string length counter to a one character string length value. Generally, 'string+character' is added to the dictionary following an unsuccessful match (105).

Figure 6:
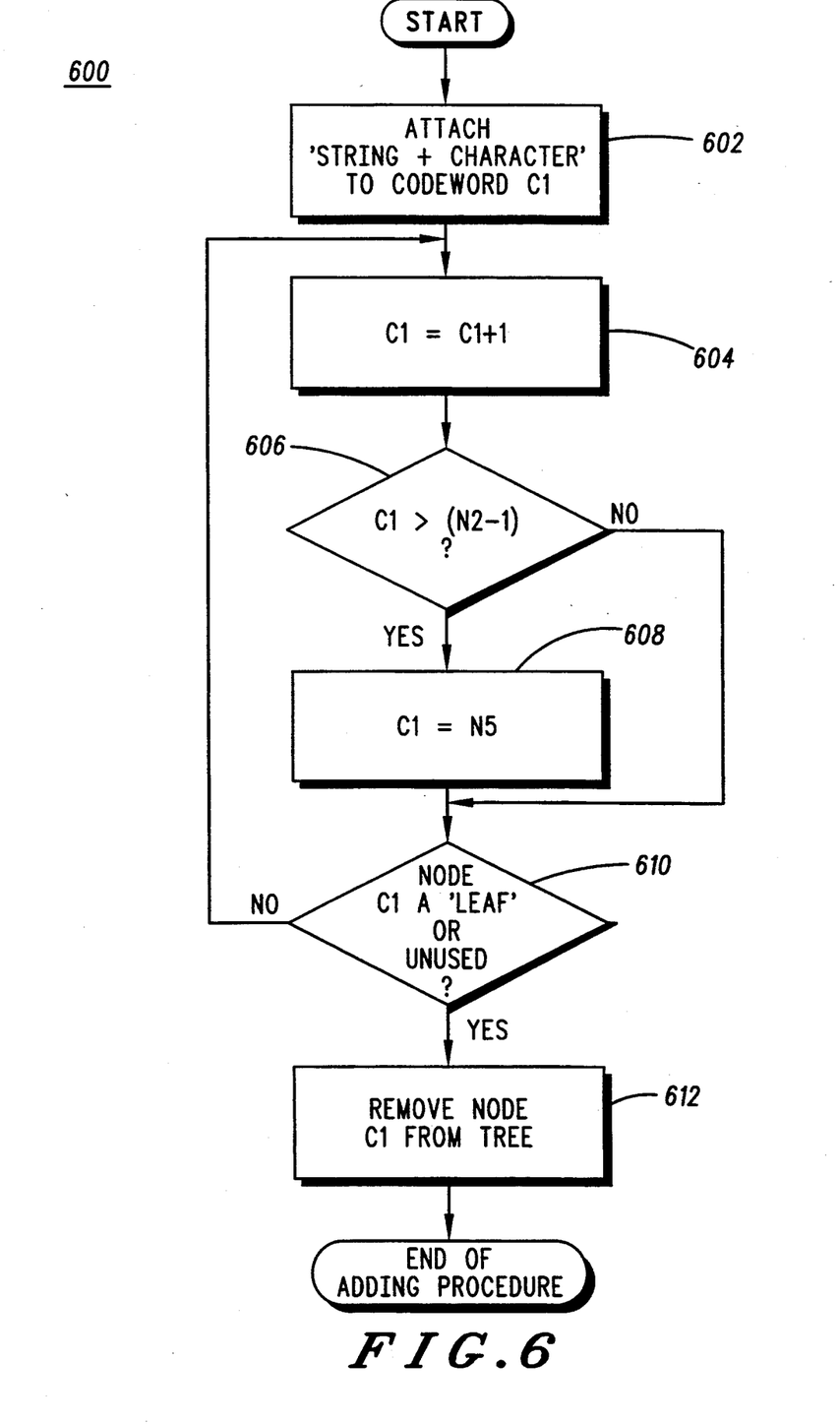
FIG. 6 is a flow diagram showing the steps of one embodiment of adding a string to a dictionary using the method of the present invention.

Adding 'string+character' to the dictionary in accordance with the method of the present invention, illustrated in FIG. 6, numeral 600, typically includes the steps of: 1) attaching (602) 'string+character' to a codeword C1 that represents a node of a tree; 2) incrementing (604) the codeword C1 (C1=C1+1); 3) determining (606) whether the codeword C1 is greater than a predetermined value (N2−1); 4) where the codeword C1 is greater than N2−1, setting (608) the codeword C1 to a preset value N5, then proceeding to step 6 below, 5) where the codeword C1 is less than or equal to N2−1, proceeding to step 6; 6) determining (610) whether node C1 is a leaf (unused); 7) where the C1 node is a leaf, removing (612) node C1 from the tree and ending the adding procedure, and 8) where the node C1 is a non-leaf, recycling (610-NO) to step 2.

Figure 2:
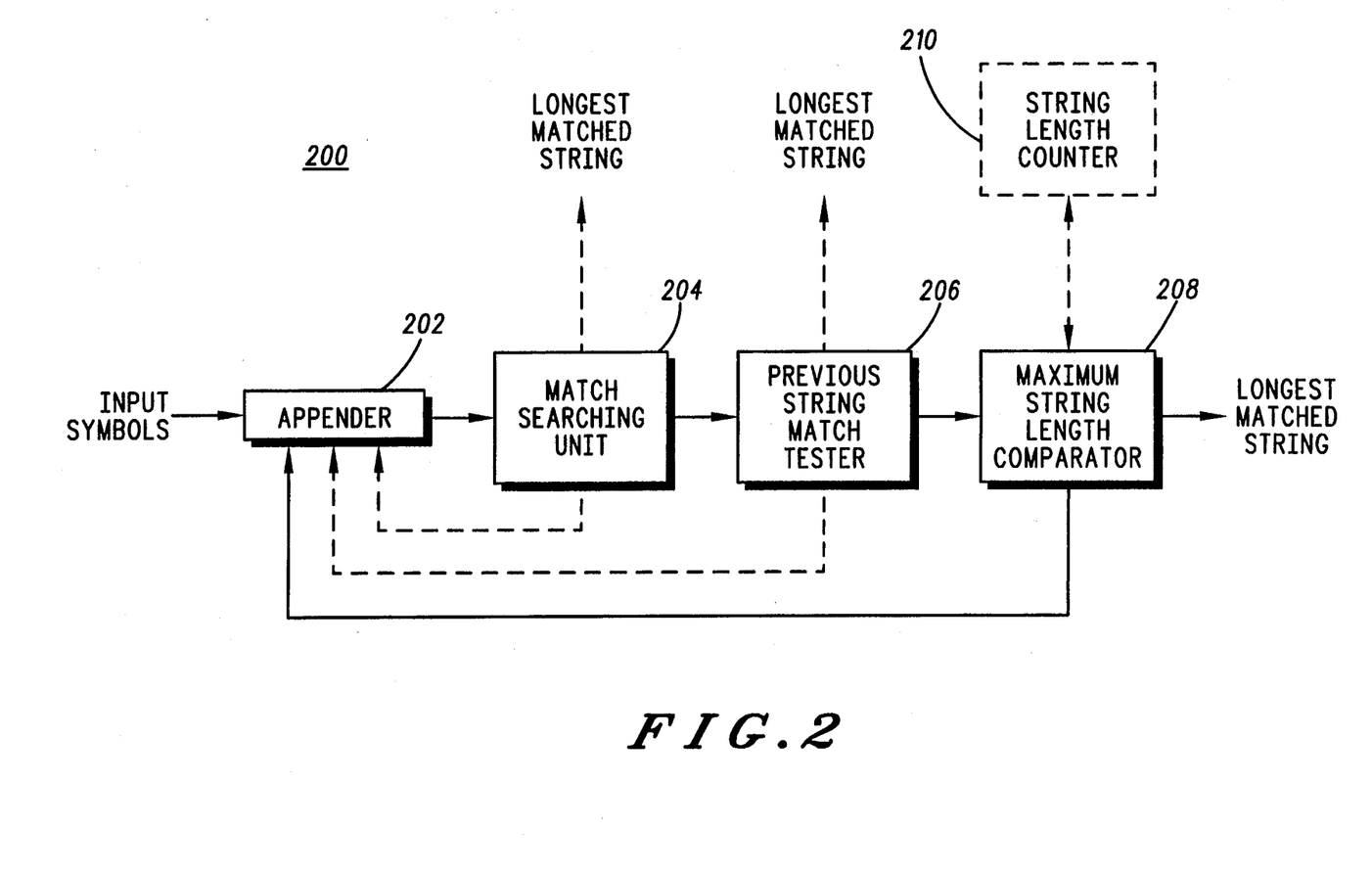
FIG. 2 is a block diagram illustrating one embodiment of a device in accordance-with the present invention.

FIG. 2, numeral 200, is a block diagram illustrating one embodiment of a device in accordance with the present invention. The device (200) utilizes a string matching procedure to efficiently provide a longest matched string for a plurality of input symbols in a data compression encoder/decoder, wherein a 'string' begins as one of: a first input/received symbol and a null string and a 'character' is, correspondingly, one of: a next input/received symbol and a first input/received symbol. The device includes an appender (202), a match searching unit (204), a previous string match tester (206), and a maximum string length comparator (208).

The appender (202) is operably coupled to receive the input symbols, which include the 'string' and the 'character' as described above, and is utilized for appending the 'character' onto the 'string' to form a 'string+character' (S+C).

The match searching unit (204) is operably coupled to the apppender (202) and is used for searching for a match of the 'string+character' in a dictionary (included in the match searching unit), and, where there is an unsuccessful match, for terminating the string matching procedure for the 'string+character'.

The previous string match tester (206) is operably coupled to the match searching unit (204), for, where there is a successful match in the dictionary, testing whether the 'string+character' is a match of a string created by the string matching procedure executed immediately previously, and where the 'string+character' is the string created by the immediately previous string matching procedure, for terminating the string matching procedure for the 'string+character' and, where selected, signalling the appender (202) to begin a next string matching procedure.

The maximum string length comparator (208) is operably coupled to the previous string match tester (206) and the appender (202), for, where the 'string+character' is a string other than the string created by the immediately previous string matching procedure, determining whether a length of the 'string+character' is less than or equal to a predetermined maximum string length, and one of: where the string length is less than the predetermined maximum string length, for signalling the appender to begin a next string matching procedure with 'string+character' as the 'string' and 'character' as the next input symbol, and where the string length is equal to the predetermined maximum string length, for terminating the string matching procedure for the 'string+character'.

The device may be selected to further include a string length counter (210) that is operably coupled to the maximum string length comparator (208) and is used for updating the length of the 'string+character'.

Updating the length of the 'string+character' typically comprises decrementing a value of the string length counter.

Where the maximum string length comparator determines whether the length of the 'string+character' is equal to a predetermined maximum string length, the determination is generally made by comparing the value of the string length counter to a checking value, which is typically set equal to zero where the string length counter decrements from a NULL string length value (typically the predetermined maximum string length) that represents a predetermined maximum string length. For example, a predetermined maximum string length of 32 is workable.

Again, where the length of the 'string+character' is equal to the predetermined maximum string length, the 'string+character' represents a longest matched string, and typically, the maximum string length comparator signals the appender (202) to begin a next string matching procedure with the 'string' equal to a NULL string and, if selected, resets the string length counter (210) to a NULL string length value that is equal to the predetermined maximum string length. Alternatively, the maximum string length comparator may signal the appender (202) to begin the next string matching procedure with the 'character' as the next input symbol and, if selected, to reset the string length counter (210) to a one character string length value that is equal to the predetermined maximum string length minus one.

Where the 'string+character' is the string created by the string matching procedure executed immediately previously, the 'string' is the longest matched string, and typically, the previous string match tester signals the appender (202) to begin a next string matching procedure with the 'character' as the 'string' and, if selected, to reset the string length counter (210) to a one character string length value that is equal to the predetermined maximum string length minus one.

Where there is an unsuccessful match, the 'string' represents the longest matched string and the 'character' represents an unmatched character.

Where there is an unsuccessful match, the match searching unit (204) terminates the string matching procedure for the 'string+character', signals the appender (202) to begin a next string matching procedure with the 'character' from the "string+character' as the 'string', and, if selected, resets the string length counter (210) to a one character string length value that is equal to the predetermined maximum string length minus one.

The match searching unit (204) may further be selected to add the 'string+character' to the dictionary following an unsuccessful match.

Figure 3:
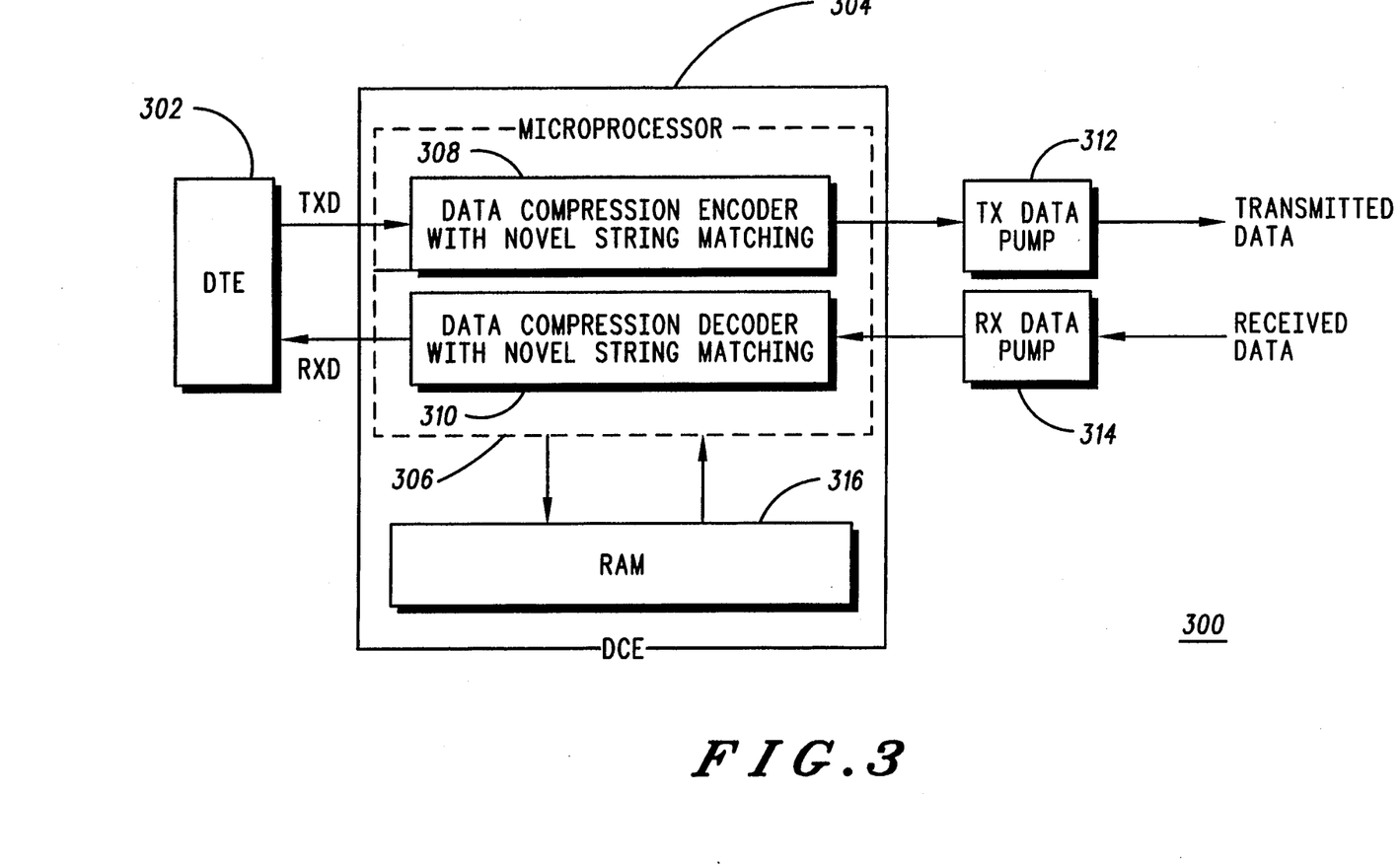
FIG. 3 is a block diagram of one embodiment of a data compression encoder/decoder of data communications equipment (DCE) utilizing the novel string matching method of the present invention.

For example, a block diagram of one embodiment of a data compression encoder (308)/decoder (310) of data communications equipment (DCE) (304) utilizing the novel string matching method (100) of the present invention is illustrated in FIG. 3, numeral 300. In this embodiment, data terminal equipment (DTE) (302) is operably coupled to transmit and receive data to/from a DCE (304) that further transmits and receives data with other communications systems/equipment. The DCE (304) includes a microprocessor (306) that is operably coupled to receive data transmitted from the DTE, and includes a data compression encoder (308) that utilizes the novel string matching of the present invention to compress data and transmit data to a transmission data pump (TX data pump) (312) of the DCE (304) for further transmission. The microprocessor (306) further includes a data compression decoder (310) that obtains received compressed data from a receiving data pump (RX data pump) (314) and utilizes the novel string matching of the present invention to decompress the compressed data and transmit the decompressed data to the DTE (302). Typically, the microprocessor (304) is also operably coupled to send and receive information from a random access memory (RAM) (316).

Figure 4:
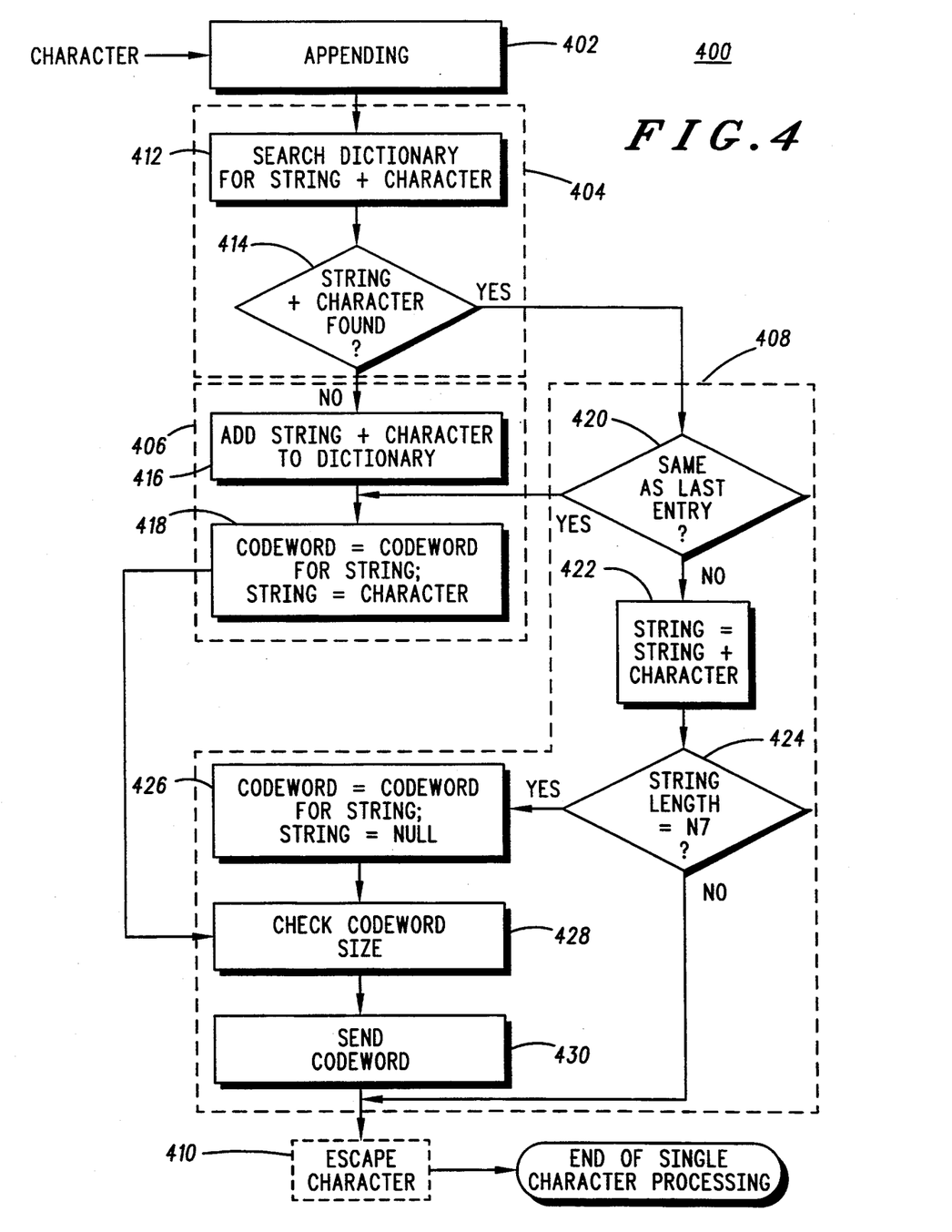
FIG. 4 is a flow diagram showing the steps of one embodiment of single character processing in a compressed mode using the method of the present invention.

FIG. 4, numeral 400, is a flow diagram showing the steps of one embodiment of single character processing in a compressed mode using the method of the present invention. The method efficiently provides a longest matched string for an input symbol character in a data compression encoder/decoder, wherein a 'string' begins as one of: a first input/received symbol and a null string and a 'character' is, correspondingly, one of: a next input/received symbol and a first input/received symbol, utilizing a string matching procedure. The method includes, for each single character processing in a compressed mode, the steps of: 1) appending (402) the 'character' onto the 'string' to form a 'string+character', 2) searching (404) for a match of the 'string+character' in a dictionary (412, 414), 3) where there is a successful match, testing (420) whether the 'string+character' is a string created by the string matching procedure executed immediately previously, 4) where the 'string+character' is a string other than the string created by the immediately previous string matching procedure, setting 'string' equal to 'string+character' (422) and determining whether a length of the 'string+character' is equal to a predetermined maximum string length (N7) (424), 5) where the string length is unequal to (less than) the predetermined maximum string length, where selected, maintaining (410) a preselected escape character and ending the single character processing, 6) where the string length is equal to the predetermined maximum string length, setting a codeword (426) to a codeword for the 'string' and string=NULL, checking the codeword size (428), sending the codeword (430), maintaining (410) the preselected escape character where selected, and ending the single character processing, 7) where the 'string+character' is the string created by the immediately previous string matching procedure, setting the codeword (418) to a codeword for the 'string' and string=character, checking the codeword size (428), sending the codeword (430), maintaining (410) the preselected escape character where selected, and ending the single character processing, 8) where there is an unsuccessful match, adding (406) 'string+character' to the dictionary (416), setting the codeword (418) to a codeword for the 'string' and string=character, checking the codeword size (428), sending the codeword (430), maintaining (410) the preselected escape character where selected, and ending the single character processing.

Figure 5:
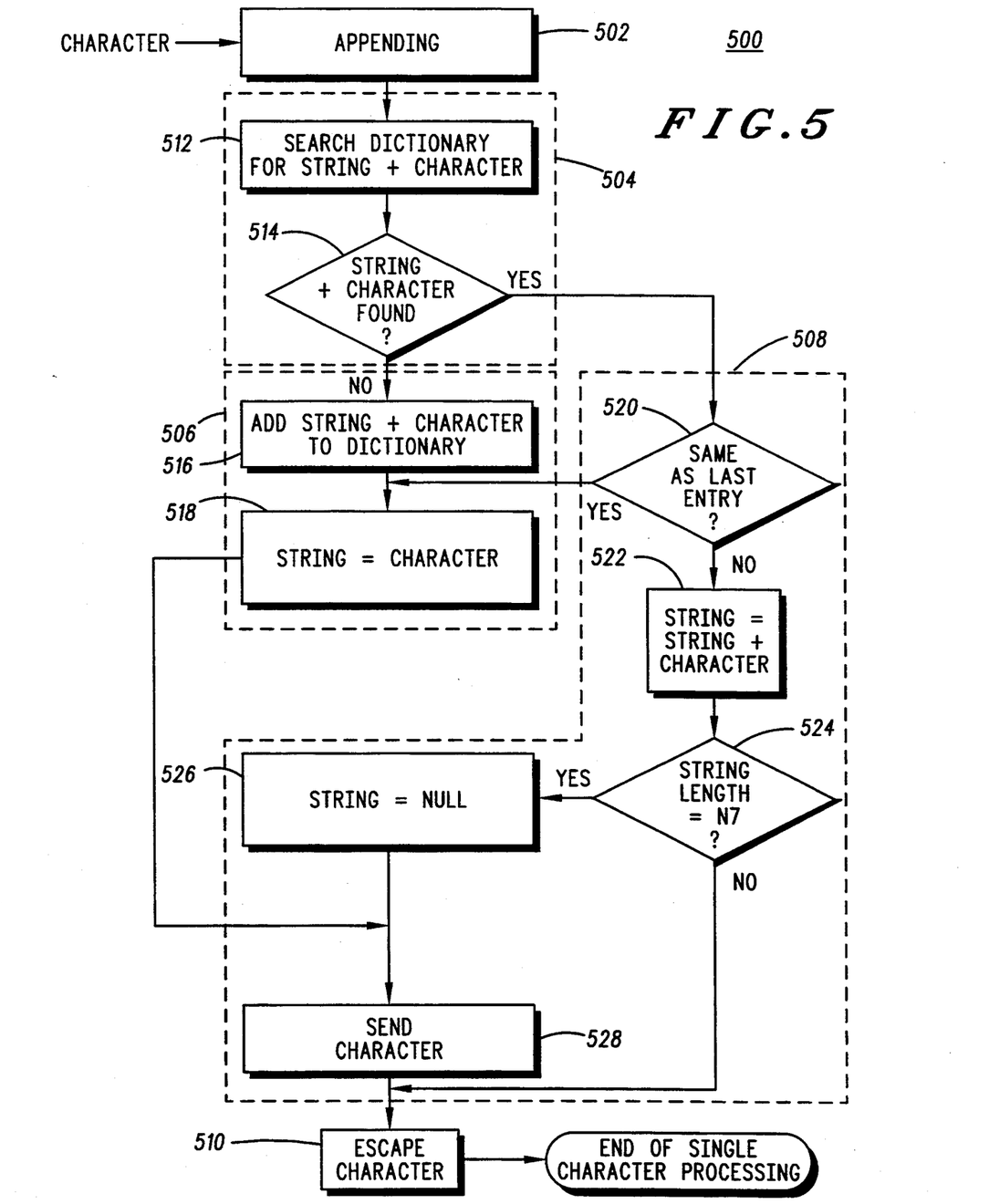
FIG. 5 is a flow diagram showing the steps of one embodiment of single character processing in a transparent mode using the method of the present invention.

FIG. 5, numeral 500, is a flow diagram showing the steps of one embodiment of single character processing in a transparent mode using the method of the present invention. The method efficiently provides a longest matched string for an input symbol character in a data compression encoder/decoder, wherein a 'string' begins as one of: a first input/received symbol and a null string and a 'character' is, correspondingly, one of: a next input/received symbol and a first input/received symbol, utilizing a string matching procedure. The method matching procedure included, for each single character processing in a transparent mode, the steps of: 1) appending (502) the 'character' onto the 'string' to form a 'string+character', 2) searching (504) for a match of the 'string+character' in a dictionary (512, 514); 2) where there is a successful match, testing (520) whether the 'string+character' is a string created by the string matching procedure executed immediately previously; 3) where the 'string+character' is a string other than the string created by the immediately previous string matching procedure, setting (522) 'string' equal to 'string+character' and determining (524) whether a length of the 'string+character' is equal to a predetermined maximum string length (N7); 4) where the string length is unequal to (less than) the predetermined maximum string length, sending (528) the character and maintaining (510) a preselected escape character and ending the single character processing; 5) where the string length is equal to the predetermined maximum string length, setting string=NULL, sending (528) the character, maintaining (510) the preselected escape character, and ending the single character processing; 6) where the 'string+character' is the string created by the immediately previous string matching procedure, setting (518) string=character, sending (528) the character, maintaining (510) the preselected escape character, and ending the single character processing; 7) where there is an unsuccessful match, adding (506) 'string+character' to the dictionary (516) and setting string=character (518), sending the character (528), maintaining (510) the preselected escape character, and ending the single character processing.

Although exemplary embodiments are described above, it will be obvious to those skilled in the art that many alterations and modifications may be made without departing from the invention. Accordingly, it is intended that all such alterations and modifications be included within the spirit and scope of the invention as defined in the appended claims.

I claim:

1. A method for efficiently providing a longest matched string for a plurality of input symbols in a data compression encoder/decoder, wherein a 'string' begins as a null string/a first input/received symbol and a 'character' is, correspondingly, a first/next input/received symbol, utilizing a string matching procedure comprising, for each cycle, the steps of:

1A) appending the 'character' onto the 'string' to form a 'string+character', 1B) searching for an entry in a dictionary that matches the 'string+character' in the dictionary, 1B1) where there is a successful match, testing whether the entry is created by the string matching procedure executed immediately previously, 1B1a) where the entry is other than the entry created by the immediately previous string matching procedure, determining whether a length of the 'string+character' is equal to a predetermined maximum string length, and one of 1B1a1–1B1a2:

1B1a1) where the string length is less than the predetermined maximum string length, recycling to step 1A, and continuing the string matching procedure with 'string+character' as the 'string' and 'character' as the next input symbol, 1B1a2) where the string length is equal to the predetermined maximum string length, terminating the cycle of the string matching procedure, 1B1b) where the 'string+character' is the string created by the immediately previous string matching procedure, terminating the cycle of the string matching procedure, 1B2) where there is an unsuccessful match, terminating the cycle of the string matching procedure.

2. The method of claim 1 further including, prior to testing whether the length of the 'string+character' is equal to the predetermined maximum string length, the step of adjusting a string length counter to represent the length of the 'string+character'.

3. The method of claim 2 wherein adjusting the string length counter to represent the length of the 'string+character' comprises decrementing a value of the string length counter.

4. The method of claim 1 wherein the step of determining whether the length of the 'string+character' is equal to a predetermined maximum string length comprises comparing the value of the string length counter to a predetermined checking value.

5. The method of claim 4 wherein the predetermined checking value is equal to zero.

6. The method of claim 1 wherein, where the length of the 'string+character' is equal to the predetermined maximum string length, the 'string+character' represents a longest matched string.

7. The method of claim 6 wherein, where the length of the 'string+character' is equal to the predetermined maximum string length, recycling to step 1A with 'string' equal to the NULL string.

8. The method of claim 7 wherein, where the 'string' is the null string, further including a step of resetting a string length counter to a NULL string length value.

9. The method of claim 8 wherein the NULL string length value is equal to the predetermined maximum string length.

10. The method of claim 6 wherein, where the length of the 'string+character' is equal to the predetermined maximum string length, recycling to step 1A with 'string' equal to a next input symbol.

11. The method of claim 10 further including the step of resetting a string length counter to a one character string length value.

12. The method of claim 11 wherein the one character string length value is equal to the predetermined maximum string length minus one.

13. The method of claim 1 wherein where the 'string+character' is the string created by the string matching procedure executed immediately previously, the 'string' is the longest matched string.

14. The method of claim 13 further including recycling to step 1A and restarting the string matching procedure with the 'character' as the 'string'.

15. The method of claim 14 further including the step of resetting the string length counter to a one character string length value.

16. The method of claim 15 wherein the one character string length value is equal to the predetermined maximum string length minus one.

17. The method of claim 1 wherein, where there is an unsuccessful match, the 'string' represents the longest matched string and the 'character' represents an unmatched character.

18. The method of claim 17 further including, following an unsuccessful match in step 1B2, recycling to step 1A and restarting the string matching procedure with the 'character' from the 'string+character' as the 'string'.

19. The method of claim 18 further including the step of resetting the string length counter to a one character string length value.

20. The method of claim 19 wherein the one character string length value is equal to the predetermined maximum string length minus one.

21. The method of claim 1 further including the step of adding the 'string+character' to the dictionary following an unsuccessful match in step 1B2.

22. A device for utilizing a string matching procedure to efficiently provide a longest matched string for a plurality of input symbols in a data compression encoder/decoder, wherein a 'string' begins as a null string/a first input/received symbol and a 'character' is, correspondingly, a first/next input/received symbol, comprising:

22A) an appender, operably coupled to receive the input symbols, for appending the 'character' onto the 'string' to form a 'string+character', 22B) a match searching unit, operably coupled to the apppender, for searching for an entry in a dictionary that matches the 'string+character' in the dictionary, and, where there is an unsuccessful match, for terminating the string matching procedure for the 'string+character', 22C) a previous string match tester, operably coupled to the match searching unit, for, where there is a successful match in the dictionary, testing whether the 'string+character' is an entry created by the string matching procedure executed immediately previously, and where the 'string+character' is the entry created by the immediately previous string matching procedure, for terminating the string matching procedure for the 'string+character' and, where selected, signalling the appender to begin a next string matching procedure, 22D) a maximum string length comparator, operably coupled to the previous string match tester, for, where the 'string+character' is an entry other than the entry created by the immediately previous string matching procedure, determining whether a length of the 'string+character' is equal to a predetermined maximum string length, and one of:
  where the string length is less than the predetermined maximum string length, for signalling the appender to begin a next string matching procedure with 'string+character' as the 'string' and 'character' as the next input symbol, and
  where the string length is equal to the predetermined maximum string length, for terminating the string matching procedure for the 'string+character'.

23. The device of claim 22 further including a string length counter, operably coupled to the maximum string length comparator, for updating the length of the 'string+character'.

24. The device of claim 23 wherein updating the length of the 'string+character' comprises decrementing a value of the string length counter.

25. The device of claim 23 wherein the maximum string length comparator determines whether the length of the 'string+character' is less than or equal to a predetermined maximum string length by comparing the value of the string length counter to a predetermined checking value.

26. The device of claim 25 wherein the predetermined checking value is equal to zero.

27. The device of claim 22 wherein, where the length of the 'string+character' is equal to the predetermined maximum string length, the 'string+character' represents a longest matched string.

28. The device of claim 27 wherein, where the length of the 'string+character' is equal to the predetermined maximum string length, the maximum string length comparator terminates the string matching procedure for the 'string+character' and signals the appender to begin a next string matching procedure, to restart the string matching procedure with 'string' equal to the NULL string.

29. The device of claim 28 wherein, where the 'string' is the null string, the string length counter resets the string length counter to a NULL string length value.

30. The device of claim 29 wherein the NULL string length value is equal to the predetermined maximum string length.

31. The device of claim 27 wherein, where the length of the 'string+character' is equal to the predetermined maximum string length, the maximum string length comparator terminates the string matching procedure for the 'string+character' and signals the appender to begin a next string matching procedure, to restart the string matching procedure with 'string' equal to a next input symbol.

32. The device of claim 31 wherein the string length counter resets the string length counter to a one character string length value.

33. The device of claim 32 wherein the one character string length value is equal to the predetermined maximum string length minus one.

34. The device of claim 22 wherein where the 'string+character' is the string created by the string matching procedure executed immediately previously, the 'string' is the longest matched string.

35. The device of claim 34 wherein the appender further restarts the string matching procedure with the 'character' as the 'string'.

36. The device of claim 35 wherein the string length counter resets to a one character string length value.

37. The device of claim 36 wherein the one character string length value is equal to the predetermined maximum string length minus one.

38. The device of claim 22 wherein, where there is an unsuccessful match, the 'string' represents the longest matched string and the 'character' represents an unmatched character.

39. The device of claim 38 wherein, where there is an unsuccessful match, the match searching unit terminates the string matching procedure for the 'string+character' and signals the appender to begin a next string matching procedure, to restart the string matching procedure with the 'character' from the "string+character' as the 'string'.

40. The device of claim 39 wherein the string length counter resets the string length counter to a one character string length value.

41. The device of claim 40 wherein the one character string length value is equal to the predetermined maximum string length minus one.

42. The device of claim 22 wherein the match searching unit further adds the 'string+character' to the dictionary following an unsuccessful match.

43. A method for efficiently providing a longest matched string for an input symbol character in a data compression encoder/decoder, wherein a 'string' begins as one of: a first input/received symbol and a null string and a 'character' is, correspondingly, one of: a next input/received symbol and a first input/received symbol, utilizing a string matching procedure comprising, for each single character processing in a compressed mode, the steps of:

43A) appending the 'character' onto the 'string' to form a 'string+character', 43B) searching for an entry in a dictionary that matches the 'string+character' in the dictionary, 43B1) where there is a successful match, testing whether the 'string+character' is the entry created by the string matching procedure executed immediately previously, 43B1a) where the 'string+character' is an entry other than the entry created by the immediately previous string matching procedure, setting 'string' equal to 'string+character' and determining whether a length of the 'string+-character' is equal to a predetermined maximum string length (N7), and one of 43B1a1-43B1a2:

43B1a1) where the string length is less than the predetermined maximum string length, where selected, maintaining a preselected escape character and ending the single character processing, 43B1a2) where the string length is equal to the predetermined maximum string length, setting a codeword to a codeword for the 'string' and string=NULL, checking the codeword size, sending the codeword, maintaining the preselected escape character where selected, and ending the single character processing, 43B1b) where the 'string+character' is the entry created by the immediately previous string matching procedure, setting the codeword to a codeword for the 'string' and string=-character, checking the codeword size, sending the codeword, maintaining the preselected escape character where selected, and ending the single character processing, 43B2) where there is an unsuccessful match, adding 'string+character' to the dictionary, setting the codeword to a codeword for the 'string' and string=character, checking the codeword size, sending the codeword, maintaining the preselected escape character where selected, and ending the single character processing.

44. A method for efficiently providing a longest matched string for an input symbol character in a data compression encoder/decoder, wherein a 'string' begins as a null string/a first input/received symbol and a 'character' is, correspondingly, a first/next input/received symbol, utilizing a string matching procedure comprising, for each single character processing in a transparent mode, the steps of:

44A) appending the 'character' onto the 'string' to form a 'string+character', 44B) searching for an entry in a dictionary that matches the 'string+character' in the dictionary, 44B1) where there is a successful match, testing whether the 'string+character' is the entry created by the string matching procedure executed immediately previously, 44B1a) where the 'string+character' is an entry other than the entry created by the immediately previous string matching procedure, setting 'string' equal to 'string+character' and determining whether a length of the 'string+character' is equal to a predetermined maximum string length (N7), and one of 44B1a1–44B1a2:

44B1a1) where the string length is less than the predetermined maximum string length, sending the character and maintaining a preselected escape character and ending the single character processing, 44B1a2) where the string length is equal to the predetermined maximum string length, setting string=NULL, sending the character, maintaining the preselected escape character, and ending the single character processing, 44B1b) where the 'string+character' is the entry created by the immediately previous string matching procedure, setting string=character, sending the character, maintaining the preselected escape character, and ending the single character processing, 44B2) where there is an unsuccessful match, adding 'string+character' to the dictionary, setting string=character, sending the character, maintaining the preselected escape character, and ending the single character processing.

45. The method of claim 21 wherein adding 'string+character' to the dictionary includes the steps of:

45A) attaching 'string+character' to a codeword C1 that represents a node of a tree, 45B) incrementing the codeword C1 (C1=C1+1), 45C) determining whether the codeword C1 is greater than a predetermined value (N2−1) and one of steps 45C1–45C2:

45C1) where the codeword C1 is greater than N2−1, setting the codeword C1 to a preset value N5 and proceeding to step 45D, 45C2) where the codeword C1 is less than or equal to N2−1, proceeding to step 45D, 45D) determining whether node C1 is a leaf (unused) and one of 45D1–45D2:

45D1) where the C1 node is a leaf, removing node C1 from the tree and ending the adding procedure, and 45D2) where the node C1 is a non-leaf, recycling to step B.

* * * * *